United States Patent
Fan et al.

(10) Patent No.: US 8,058,663 B2
(45) Date of Patent: Nov. 15, 2011

(54) MICRO-EMITTER ARRAY BASED FULL-COLOR MICRO-DISPLAY

(75) Inventors: Zhaoyang Fan, Lubbock, TX (US); Jing Li, Manhattan, KS (US); Jingyu Lin, Lubbock, TX (US); Hongxing Jiang, Lubbock, TX (US)

(73) Assignee: III-N Technology, Inc., Lubbock, TX (US)

( * ) Notice: Subject to any disclaimer, the term of this patent is extended or adjusted under 35 U.S.C. 154(b) by 337 days.

(21) Appl. No.: 12/238,642

(22) Filed: Sep. 26, 2008

(65) Prior Publication Data

US 2009/0078955 A1 Mar. 26, 2009

Related U.S. Application Data

(60) Provisional application No. 60/975,381, filed on Sep. 26, 2007.

(51) Int. Cl.
*H01L 33/00* (2010.01)
(52) U.S. Cl. .......... 257/98; 257/88; 257/89; 257/91; 257/103
(58) Field of Classification Search .......... 257/88, 257/89, 91, 98, 103
See application file for complete search history.

(56) References Cited

U.S. PATENT DOCUMENTS

| | | | |
|---|---|---|---|
| 5,696,389 A * | 12/1997 | Ishikawa et al. | 257/99 |
| 6,410,940 B1 | 6/2002 | Jiang et al. | |
| 2005/0067627 A1* | 3/2005 | Shen et al. | 257/89 |
| 2008/0129191 A1* | 6/2008 | Lee et al. | 313/504 |

OTHER PUBLICATIONS

D. Sun, D.W. Treat, k. Beernink, R.D. Bringans, and G. J. Kovacs, Red and Infrared side by side semiconductor quantum well lasers integrated on a GaAs substrate, Applied Physics Letters, vol. 73, No. 13, Jul. 27, 1998, American Institute of Physics.
D. Hofstetter, D. Sun, C. Dunnrovvicz, M. Kneissl, and D.W. Treat, Multiwavelength Light Emitters for Scanning Applications Fabricated by Flipchip Bonding, IEEE Photonics Technology Letters, vol. 10, No. 10, Oct. 1998.
V. Suntharalingam, R. Berger, J. A. Burns, C. K. Chen, C. L. Keast, J. M. Knecth, R. D. Lambert, K. L. Newcomb, D. M. O'Mara, D. D. Rathman, D. C. Shaver, A. M. Soares, C. N. Stevenson, B. M. Tyrrell, K. Warner, B. D. Wheeler, D. Yost, D. J. Young, Megapixel CMOS Image Sensor Fabricated in Three-Dimensional Integrated Circuit Technology, ISSCC 2005, Session 19, Imagers, 19.6, 2005 IEEE International Solid-State Circuits Conference.
F. A. Kish, F. M. Steranka, D. C. Defevere, D.A. Vanderwater, K.G. Park, C. P. Kuo, T. D. Osentowski, M. J. Peanasky, J. G. Yu, R. M. Fletcher, D. A. Steigerwald, V. M. Robbins, Very high-efficiency semiconductor wafer-bonded transparent-substrate (AlxGa1-x)0.5In0.5P/GaP light-emitting diodes, Applied Physics, Letters vol. 64, No. 21, May 23, 1994, American Institute of Physics.
D. Armitage, I. Underwood, S. T. Wu, Introduction to microdisplays, Wiley c2006.

(Continued)

*Primary Examiner* — Tan N Tran
(74) *Attorney, Agent, or Firm* — Lathrop & Gage LLP

(57) ABSTRACT

Disclosed is a semiconductor micro-emitter array for use in a full-color microdisplay. Each pixel includes three vertically-stacked red, green, and blue micro-emitters which minimizes pixel size. The microdisplay may be exclusively based on Group III-nitride semiconductors, with differing indium concentrations in three respective InGaN/GaN active regions for emitting the three RGB colors. Alternatively the microdisplay may be based on hybrid integration of InGaN based III-nitride semiconductors for blue and green emissions, and AlGaInP based (e.g., Group III-V) semiconductors for red emissions.

11 Claims, 8 Drawing Sheets

OTHER PUBLICATIONS

H. X. Jiang, S. X. Jin, J. Li, J. Shakya and J. Y. Lin, III-nitride blue microdisplays, Applied Physics Letters, vol. 78, No. 9, Feb. 26, 2001, American Institute of Physics.

P. D. Floyd, C. L. Chua, D. W. Treat, and D. P. Bour, Wafer Fusion of Infrared Laser Diodes to GaN Light-Emitting Heterostructures, IEEE Photonics Technology Letters, vol. 10, No. 11, Nov. 1998.

\* cited by examiner

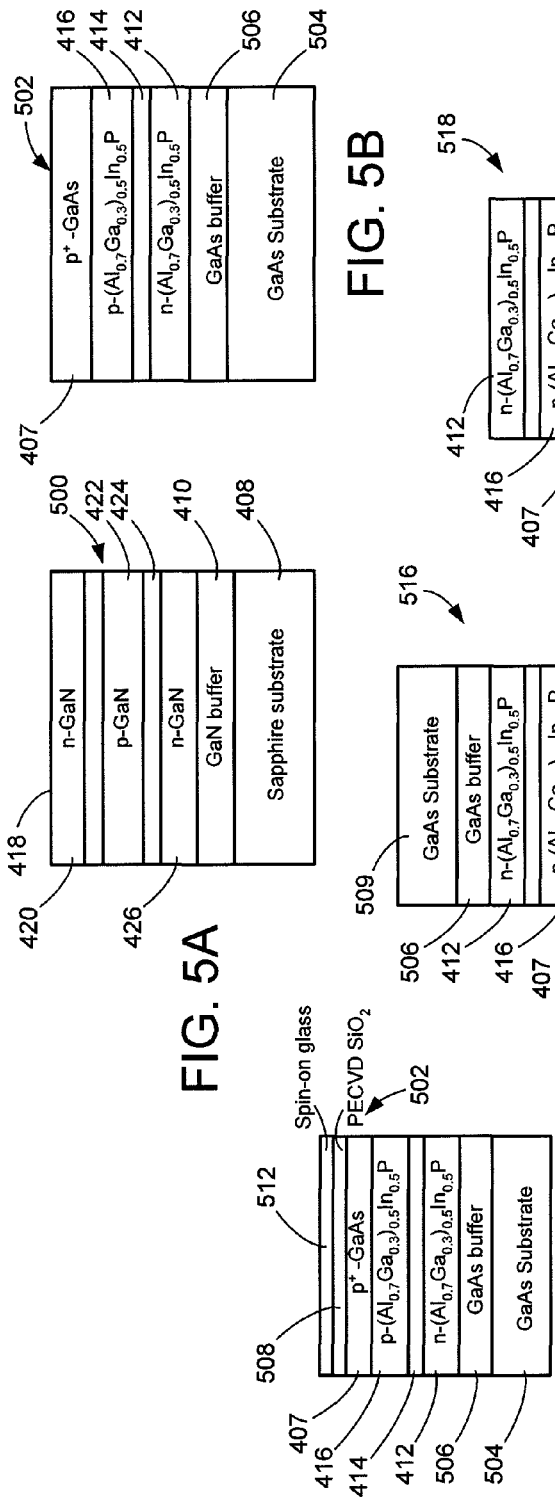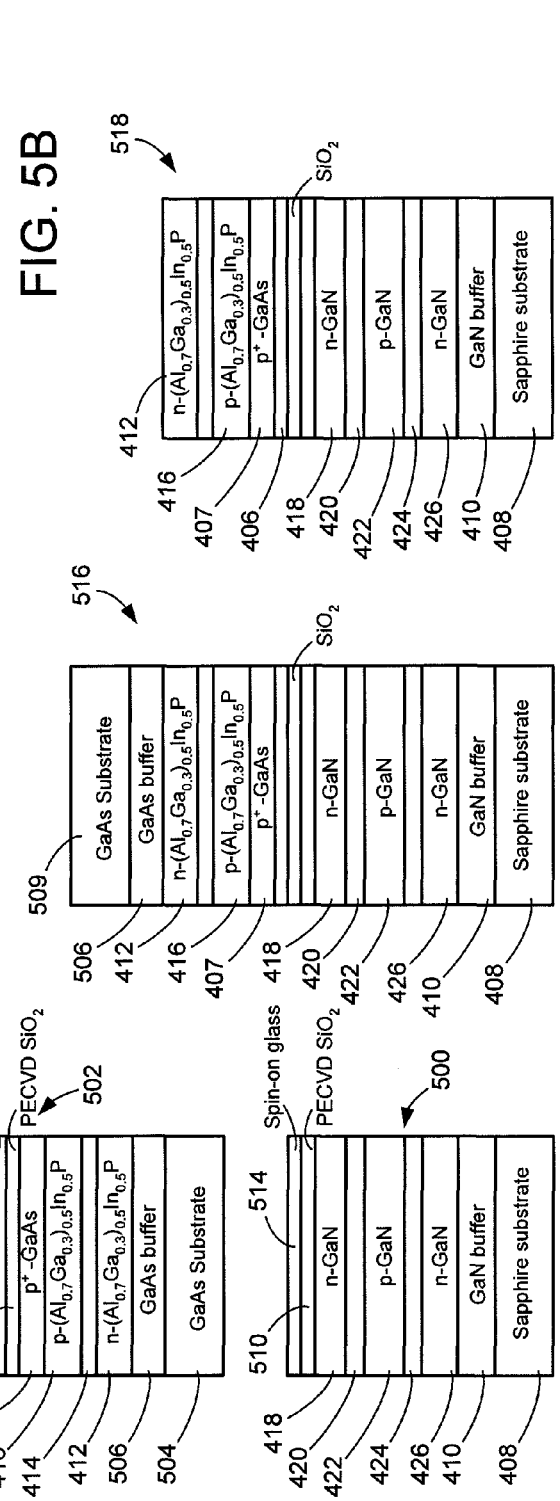

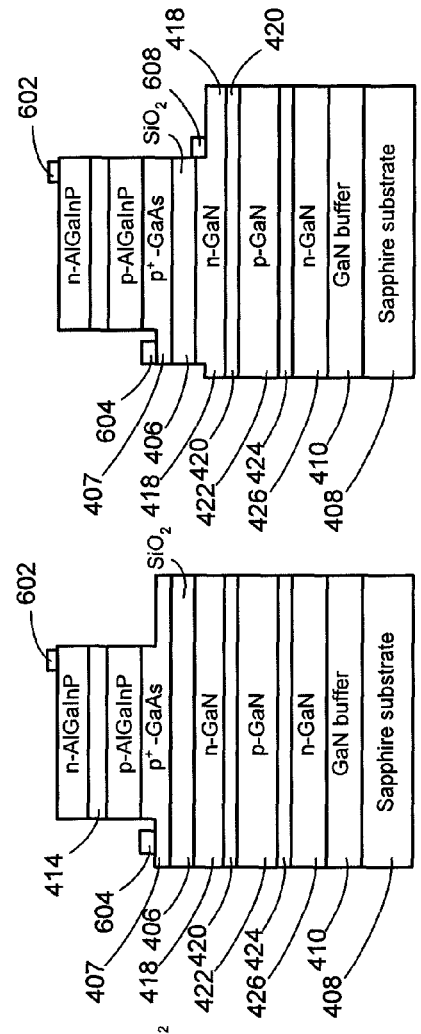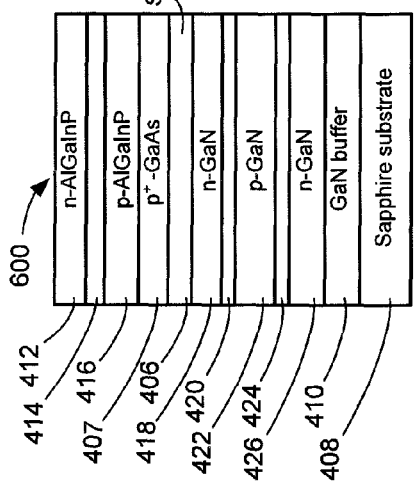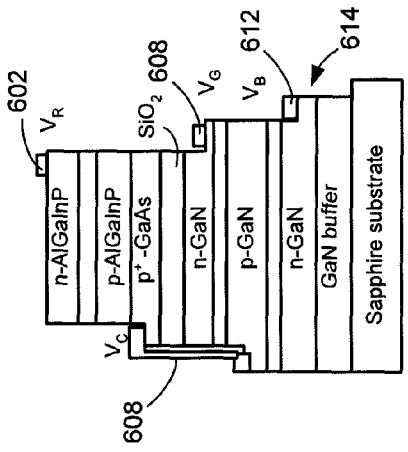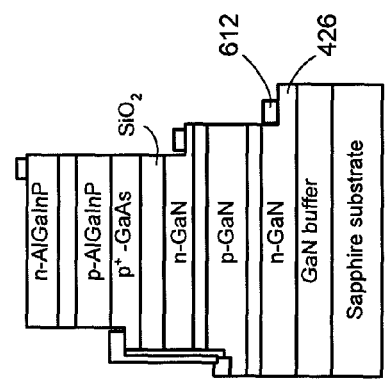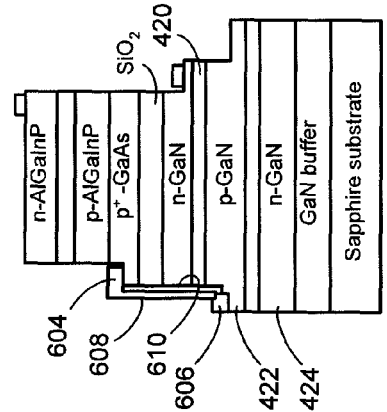

MICRO-EMITTER ARRAY BASED FULL-COLOR MICRO-DISPLAY

CROSS-REFERENCE TO RELATED APPLICATIONS

This application claims the benefit of U.S. Provisional Application No. 60/975,381 filed Sep. 26, 2007, the disclosure of which is incorporated herein by reference.

BACKGROUND OF THE INVENTION

1. Field of the Invention

The invention relates generally to the field including microdisplay devices and the methods of making them. More specifically, the invention relates to the fabrication of RGB pixels for use in microdisplays.

2. Description of the Related Art

Microdisplays have many military and civilian applications, for example to provide head-mounted displays, handheld projectors, heads-up displays, and other near-to-eye applications. Microdisplays with high resolution, power efficiency, reliability, and other merits may enable various high-performance portable applications. One category of microdisplays is modulating microdisplays, such as liquid crystal or digital mirror device (DMD) based displays. These are relatively mature in terms of technology, driven by the commercial markets of projection TV and other applications. These modulating microdisplays are blanket illuminated by separate light sources and modulate incident light on a pixel-by-pixel basis, with intrinsically low power efficiency. Due at least in part to this mode of operation, the field-of-view, brightness, and contrast of these modulation-based microdisplays are limited. Another category is emissive microdisplays, which should provide high power efficiency—a critical requirement for portable near-to-eye (NTE) head mounted systems or dismounted mobile systems, especially for field applications. Currently, emissive microdisplay technology is typically based on color-filtered organic light emitting diode (OLED) technology. Although dramatic progress has been made in the OLED field in the last 20 years, the electro-optical performance, power efficiency and lifetime of OLEDs themselves are still inferior to their inorganic counterparts, LEDs. OLED microdisplays suffer not only from a shorter life span but also from nonuniform degradation of luminance for various colors over their lifespan. Furthermore, because of technical difficulties such as conflicting temperatures that may be required for growth of different color organic thin films, and incompatibility with conventional photolithography micro-patterning processes, full-color OLED microdisplays with high resolution based on side-by-side patterned RGB sub-pixels have not been demonstrated. Present day, technically mature approaches utilize filtering of broadband white emitters. For example, a white light-emitting OLED may be grown on a pre-patterned substrate without the necessity for post-deposition patterning, but approximately ⅔ or more of the white light source output must be removed by a filter to obtain the required RGB primary colors. For example, up to 90% of optical power from a white OLED may have to be filtered out in order to obtain a sufficiently saturated red sub-pixel. In such a case, the OLED must be driven up to ten times brighter than the required pixel brightness, which substantially shortens a lifetime of the microdisplay. Degradation is further enhanced by the heat generated when the filters absorb light at wavelengths other than the intended color. Even with its inherent power inefficiency, color filtering OLED microdisplays represent the most widely commercialized emissive microdisplay technology used in military and commercial systems.

In U.S. Pat. No. 6,410,940, the entire contents of which are herein incorporated by reference, a monochrome microdisplay based on semiconductor micro-size emitters is disclosed that can provide high brightness and efficiency, high reliability and long lifetime. The '940 display is not full-color, however. Furthermore, since the fabrication of certain semiconductor emitters may not be compatible with the silicon integrated circuits that provide the current needed to light up, or drive an LED, a/k/a "driver" IC chips, microdisplays formed from such emitters cannot be directly constructed on such IC chips.

SUMMARY

The present invention is defined by the claims below. Embodiments of the disclosed devices and methods include a pixel for use in a multicolor illumination device. The pixel, in embodiments, includes red, green, and blue emitters which are vertically stacked one on top of the other onto a substrate. Both the green and blue emitters are caused to be transparent relative to a red light emission from the red emitter, and the blue emitter is caused to be transparent relative to a green light emission from the green emitter. In some embodiments the substrate is transparent to all of the red, green, and blue light emissions, and in some instances can be comprised of sapphire.

In some embodiments, the devices discussed above can include an arrangement where the red, green, and blue emitters are all comprised of Group III-nitride semiconductor structures. In some embodiments the red, green, and blue emitters are comprised of InGaN-based structures.

The pixel embodiments can be fabricated according to an order of stacking of the emitters which includes the blue emitter being deposited proximate the substrate, the green emitter being deposited above the blue emitter, and the red emitter being deposited above the green emitter, the red, green, and blue light emissions passing through the transparent substrate to contribute to a multicolor display. The pixel structure can comprise (i) a buffer layer deposited on the substrate; (ii) a first n-GaN layer deposited above the buffer layer; (iii) a first InGaN/GaN multi-quantum well (MQW) active region deposited above the first n-GaN layer, the first InGaN/GaN MQW active region being adapted to generate the blue emissions; (iv) a first p-GaN layer deposited above the first InGaN/GaN MQW active region; (v) an at least semi-insulative layer deposed deposited above the first p-GaN layer; (vi) a second p-GaN layer deposited above the at least semi-insulative layer; (vii) a second InGaN/GaN MQW active region deposited above the second p-GaN layer, the second InGaN/GaN MQW active region adapted generate the green emissions; (viii) a second n-GaN layer deposited above the second InGaN/GaN MQW active region; (ix) a third InGaN/GaN MQW active region deposited above the second n-GaN layer, the third InGaN/GaN MQW active region adapted to generate the red emissions; and (x) a third p-GaN layer deposited above the third InGaN/GaN MQW active region.

The device can include an electrical arrangement wherein a first n-contact at the blue emitter electrically connected to a second n-contact shared by the red emitters and the green emitter, the first and second n-contacts together providing a common ground to the device arrangement; a first p-contact electrically connected with the blue emitter; a second p-contact electrically connected with the green emitter; a third p-contact electrically connected with the red emitter; and the first, second, and third p-contacts are able to be independent from each other enabling individual control of the blue, green, and red emitters.

An alternative structural arrangement can include a buffer layer deposited on the substrate; a first n-GaN layer deposited above the buffer layer; a first MQW adapted for generating the blue light emission, the first MQW deposited above the first n-GaN layer; a first p-GaN layer deposited above the first MQW; a first tunneling junction deposited above the first p-GaN layer; a second n-GaN layer deposited above the first tunneling junction; an insulative layer deposited above the second n-GaN layer; a third n-GaN layer deposited above the insulative layer; a second tunneling junction deposited above the third n-GaN layer; a second p-GaN layer deposited directly above the second tunneling junction; a second MQW deposited above the second p-GaN layer, the second MQW adapted to generate the green light emission; a fourth n-GaN layer deposited above the second MQW layer; a third MQW layer deposited above the fourth n-GaN layer, the third MQW layer adapted to generate the red light emission; a third p-GaN layer deposited above the third MQW layer; a third tunneling junction deposited above the third p-GaN layer; and a fifth n-GaN layer deposited above the third tunneling junction.

An embodiment of the pixel structure described in the last paragraph can include an electrical connection arrangement including a common cathode electrically-connecting and grounding the first and fourth n-GaN layers; a first independent anode contact formed on the second n-GaN layer for the purpose of enabling the blue emitter to be selectively activated by administering a voltage to the first independent anode contact; a second independent anode contact formed on the third n-GaN layer for the purpose of enabling the green emitter to be selectively activated by administering a voltage to the second independent anode contact; and a third independent anode contact formed on the fifth n-GaN layer for the purpose of enabling the red emitter to be selectively activated by administering a voltage to the third independent anode contact.

In the arrangements above, the pixel can be comprised of a hybrid integration of Group III-nitride semiconductors and Group III-V semiconductors in embodiments. More specifically, the green, and blue emitters can be comprised of InGaN-based structures and the red emitter can be comprised of AlGaInP-based structures. Further, the InGaN-based structures can be separated from the AlGaInP-based structures by a red-light-transparent p$^+$-GaAs current-spreading layer atop a red-light-transparent SiO2 layer. The substrate used here may be transparent to the blue, green, and red emissions, where the pixel structure includes: a buffer layer on the substrate; a first n-GaN layer above the buffer layer; a blue emission layer above the first n-GaN layer; a first p-GaN layer above the blue emission layer; a green emission layer above the first p-GaN layer; a second n-GaN layer above the green emission layer; an electrically-isolating layer above the second n-GaN layer, the electrically-isolating layer insulating between the InGaN-based structures and the AlGaInP-based structures; a current-spreading layer above the electrically-isolating layer; a p-AlGaInP layer above the current-spreading layer; a red-emission layer above the p-AlGaInP layer; and an n-AlGaInP layer above the red-emission layer.

For the embodiment discussed in the last paragraph, a common anode can be provided for each of the blue, green, and red emitters established by electrically-connecting and grounding the current-spreading layer and the first p-GaN layer; a first independent cathode can be electrically connected with the first n-GaN layer for the purpose of enabling the blue emitter to be selectively activated by administering a voltage to the first independent cathode; a second independent cathode can be electrically connected with the second n-GaN layer for the purpose of enabling the green emitter to be selectively activated by administering a voltage to the second independent cathode; and a third independent cathode can be electrically connected with the n-AlGaInP layer for the purpose of enabling the red emitter to be selectively activated by administering a voltage to the third independent cathode.

Additionally, tunneling junctions are inserted into the InGaN-based structures for the purpose of avoiding problems encountered in plasma-etching. Further, an electrical connection can be made between a first n-contact associated with the AlGaInP-based structures and a second n-contact, the second n-contact being deposited on an n-GaN layer which is deposited between a green emissive layer and a blue emissive layer; the n-GaN layer, green emissive layer, and blue emissive layer all being included in the InGaN-based structures; the first and second contacts together creating a common-grounded anode; a first cathode associated with and electrically controlling the red emitter; a second cathode associated with and electrically controlling the green emitter; and a third cathode associated with and electrically controlling the blue emitter. In this embodiment, an order of stacking of the emitters includes the red emitter being deposited proximate the substrate, the green emitter being deposited above the red emitter, and the blue emitter being deposited above the green emitter, the red, green, and blue light emissions being directed away from the substrate to contribute to a multicolor display.

In some embodiments, the pixel is incorporated into one of: an active matrix driving circuit and processor, and (ii) an IC driver chip using one of flip-chip bonding and aligned wafer bonding.

A method is also disclosed in which an InGaN-based structure is mounted on a substrate, the InGaN-based structure including a green light emitting component and a blue light emitting component; an AlGaInP-based structure is provided, the AlGaInP-based structure including a red light emitting component; and wafer bonding is used to mount the AlGaInP-based structure onto the InGaN-based structure to create a hybrid integration of the InGaN-based and the AlGaInP-based structures.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein:

FIGS. 5A and 5B show an InGaN wafer layer structure, and an AlGaInP wafer layer structure which are provided in the processing of a pixel according to the steps shown in FIG. 5C;

FIGS. 5C-E shows a three-step wafer-bonding process used to produce an embodiment of the pixels shown in FIGS. 5A-B;

FIGS. 6A-F show process embodiments for the steps used to finalize fabrication of the pixel using the structures produced in FIGS. 5C-E.

DETAILED DESCRIPTION

Figure 1A:
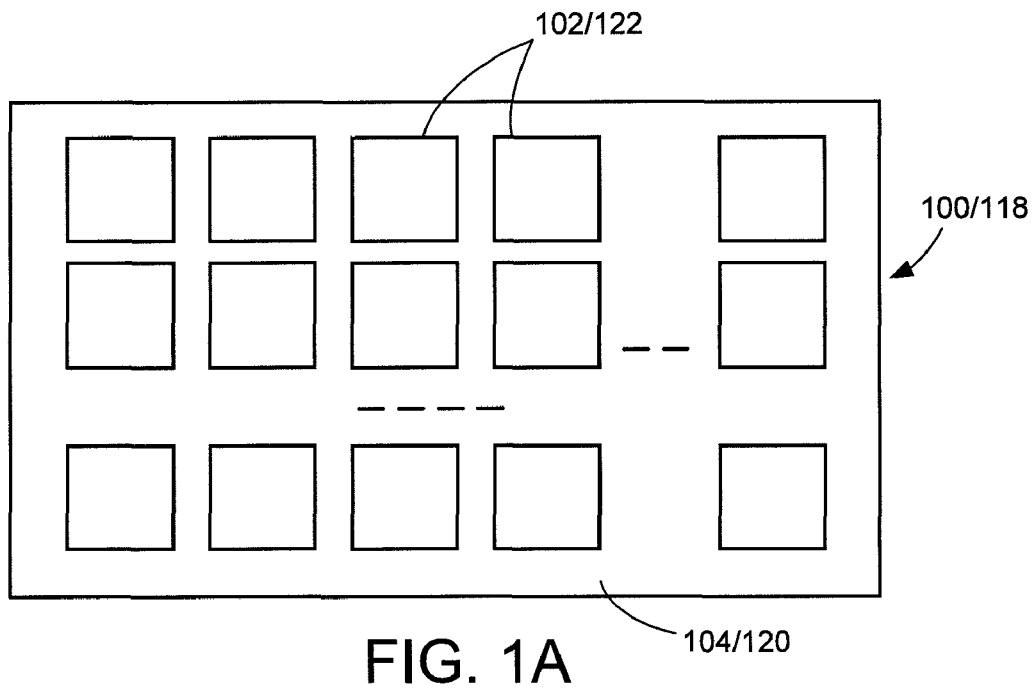
FIG. 1A is a plan view of a microdisplay with pixels arranged in a matrix format on a substrate.

Embodiments of the present invention provide color microdisplay elements systems and methods for making those elements. More specifically, disclosed is a semiconductor micro-emitter array based microdisplays, and in particular to full-color microdisplays with each pixel containing three micro-emitters—red, green, and blue (RGB)—vertically stacked up to minimize pixel size. The microdisplay may be exclusively based on Group III-nitride semiconductors, with differing indium concentrations in three respective InGaN/GaN active regions for emitting the three RGB colors. Alternatively the microdisplay may be based on hybrid integration of InGaN based III-nitride semiconductors for blue and green emissions, and AlGaInP based (e.g., Group III-V) semiconductors for red emissions. It is possible that other III-V structures could be used instead of AlGaInP, however.

In embodiments, the hybrid integration may be based on wafer bonding, such as $SiO_2$ based adhesive wafer bonding as described below. In embodiments, the microdisplay may be vertically integrated with a silicon based chip to achieve active driving, or the microdisplay may be controlled by an external circuit for passive matrix driving.

In an embodiment, the present invention provides a full color microdisplay based on vertically stacked semiconductor RGB micro-emitter pixels with full color tunability and a small pixel size. The RGB stacked structure is based on InGaN for blue and green wavelength emission, and on AlGaInP for red wavelength emission, and the emitters are vertically integrated through wafer bonding.

In an embodiment, wafer bonding is based on $SiO_2$ adhesive bonding, with $SiO_2$ as adhesive layer and insulation layer to electrically isolate the AlGaInP red emitter and the InGaN blue and green emitters. In another embodiment, an RGB stacked structure may be exclusively based on InGaN materials with varying indium concentrations in three respective InGaN/GaN active regions to generate the three RGB colors. The three stacked RGB emitters are arranged such that short wavelength absorption by longer wavelength emitters is avoided. The emitters are also arranged to minimize the number of electrodes required. In an embodiment, a microdisplay is coupled with a Si CMOS driver/processor chip by flip-chip bonding or aligned wafer bonding to achieve active driving. In another embodiment the microdisplay is coupled with a separate Si driver/processor chip through-circuit for passive driving.

The vertically-stacked nature of the RGB structures described herein have certain advantages over the conventional side-by-side RGB sub-pixels. For example, the stacked sub-pixels would result in a microdisplay having a resolution and a fill factor that are improved greatly—almost by a factor of three, without counting interconnection and contact area. The stacked RGB micro-emitters described herein may also improve pixel density. Utilizing InGaN for blue and green emission and AlGaInP for red emission provides high power efficiency, and the narrow bandwidth of RGB colors provides a color palette exceeding that provided by other technologies. Moreover, use of inorganic semiconductor materials helps to generate a compact, robust, and reliable system.

Embodiments are shown in FIGS. 1-8. Referring first to FIGS. 1A-C, FIG. 1A shows a microdisplay 100 consisting of an array of RGB micro-emitter pixels 102 arranged into a matrix format on a substrate 104.

Figure 1B:
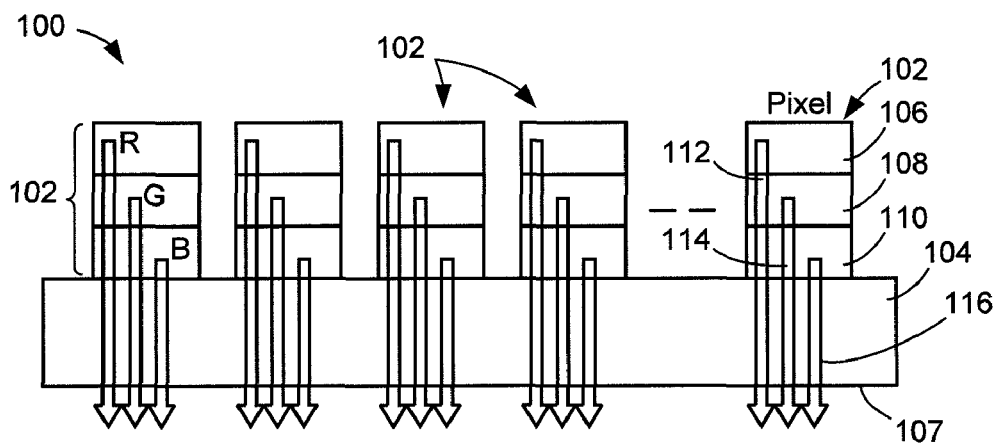
FIG. 1B is a cross-sectional view of a representation for one embodiment for the microdisplay of FIG. 1A wherein a pixel including vertically stacked RGB three micro-emitters are mounted on a transparent substrate for viewing from below the device as shown.

With respect to the embodiment shown in FIG. 1B, the cross-sectional view provided shows the structure of each RGB pixel 102. Each RGB pixel 102 consists of three micro-emitters 106, 108, and 110 which are all vertically stacked on each other. Micro-emitters 106, 108, and 110 may be independently controlled to emit red, green, and blue emissions respectively, so that each pixel 102 is fully color-tunable, has a footprint size, and requires the same overhead for interconnection as does one micro-emitter. Substrate 104 in FIG. 1B is light transparent (for example, sapphire), and the blue micro-emitter 110 is at the "bottom," (e.g., next to substrate 104). Green emitter 108 is positioned in the middle and a red emitter 106 is the furthest away from substrate 104, on the top of the stack. A front surface 107 of microdisplay 100 is a bottom surface of substrate 104.

With this geometric arrangement, a red emission 112 from micro-element 106 will not be absorbed or blocked by underlying green and blue emitters 108 and 110 because the photon energy of red emissions is lower than the semiconductor bandgap of green and blue emitters 108 and 110. Put another way, green and blue emitters 108 and 110 are transparent to the red emissions 112 because red photons do not have enough energy to excite valence band electrons across the higher bandgap energies of green and blue emitters 108 and 110. Similarly, a green light emission 114 will not be absorbed and blocked by underlying blue emitter 110 because the photon energy of green emission 114 is lower than a semiconductor bandgap of blue emitter 110. Accordingly, red, green, and blue emissions 112, 114, and 116 can emit out through substrate 104 (which is transparent to all of emissions 112, 114, and 116) to provide a full-color image.

Figure 1C:
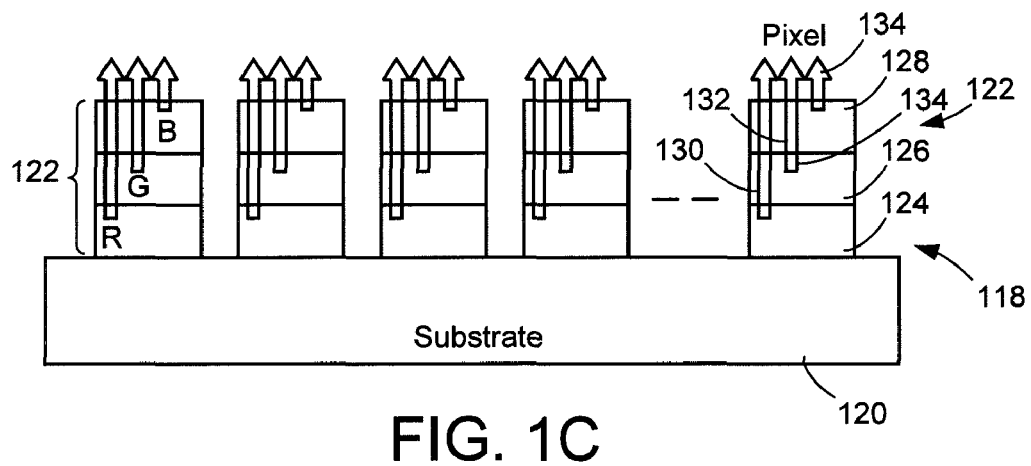
FIG. 1C is a cross-sectional view of a representation of an alternative embodiment of the FIG. 1A microdisplay wherein the reverse-stacked RGB is mounted on a substrate and the image is observed from above the device as shown.

An alternative embodiment is shown in FIG. 1C. The FIG. 1C arrangement can be equally represented by the array plan view disclosed in FIG. 1A in that it includes a substrate 120 having a plurality of pixels 122 disposed thereon. Differences are revealed in the FIG. 1C cross section, however. Referring to FIG. 1C, it can be seen that a microdisplay 118 is manufactured with a substrate 120 and emitters 124, 126, and 128 in the order shown will be observed from the top of microdisplay 118, and substrate 120 can be transparent or non-transparent since light need not travel therethrough. Each pixel 122, like in the last embodiment, consists of red, green and blue micro-emitters 124, 126, and 128 stacked vertically, as shown. In the FIG. 1C arrangement, however, red emitter 124 is on the bottom (deposited directly above substrate 120), green emitter 126 is in the middle, and blue emitter 128 is on top. In this arrangement, a red emission 130 penetrates through green and blue emitters 126 and 128 without absorption, and green emission 132 penetrates through blue emitter 128 without absorption. As can be seen, this allows all of red, green, and blue emissions 130, 132, and 134 to be optionally emitted enabling a full-color image.

Figure 2A:
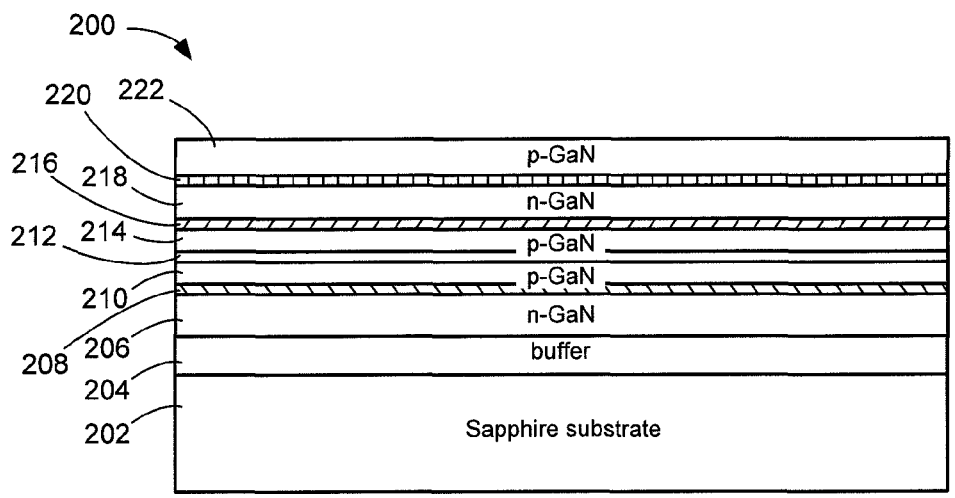
FIG. 2A shows a detailed cross-section showing the layering pre-etching which make up the FIG. 1B embodiment.
Figure 2B:
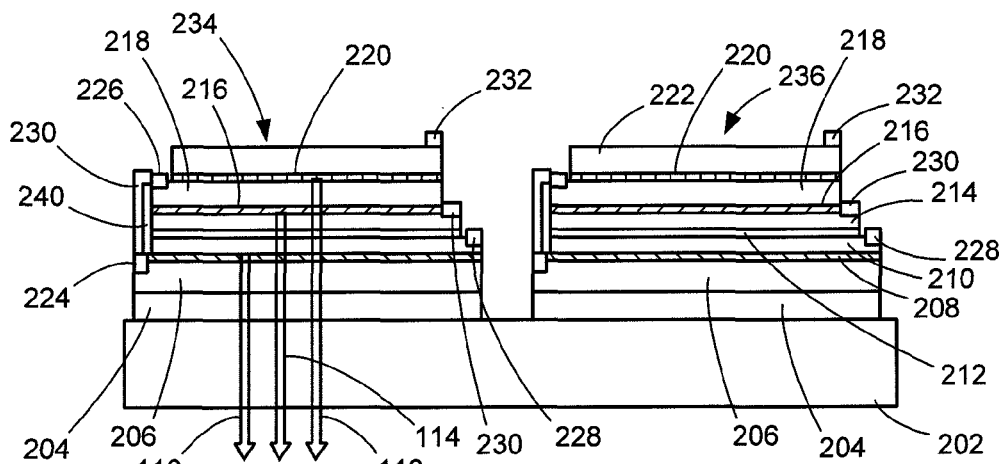
FIG. 2B shows a detailed post-etching cross-section showing the wires and contacts which make up the FIG. 1B embodiment.
Figure 2C:
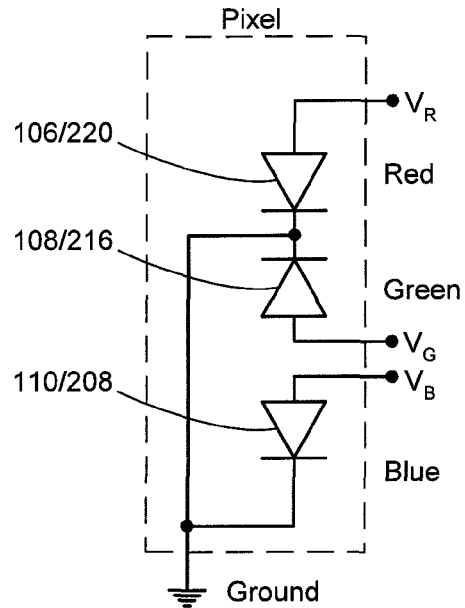
FIG. 2C shows the pixel schematic circuit diagram for FIG. 2B.

In FIGS. 2A-C, an embodiment of an RGB pixel is based on III-nitride semiconductors is illustrated. This pixel could be used in an arrangement like that shown in FIG. 1B.

Referring first to FIG. 2A, a GaN semiconductor layer structure 200 consists of three active regions for RGB emissions. The FIG. 2A nitride semiconductor materials are first epitaxially grown (using MBE (molecular beam epitaxy) or MOCVD (metallorganic chemical vapor deposition) on a transparent and insulating substrate such as sapphire substrate 202 with a structure which includes a buffer layer 204, a first n-type GaN (n-GaN) layer 206 with silicon doping, a first InGaN/GaN multi-quantum well (MQW) active region 208 with indium concentration corresponding to blue emission 116 (see FIG. 1B), a first p-type GaN (p-GaN) layer 210, an insulative or semi-insulative (for electrically isolating the first and second emitters 208 and 216) GaN or AlGaN layer 212, a second p-GaN layer (Mg doping) 214, a second InGaN/GaN MQW region 216 with suitable indium concentration for green emission 114 (see FIG. 1B), and a second n-GaN layer 218, a third InGaN/GaN MQW region 220 with suitable indium concentration for red emission 112 (see FIG. 1B), and a third p-GaN layer 222.

Each LED has three basic layers: (i) an n-type semiconductor layer, (ii) a p-type semiconductor layer and a MQW region. Electrons from the n-layer and holes from p-layer are injected into the MQW active region, where electrons and holes recombine to emit photons. The photon energy (light wavelength depends on the bandgap of InGaN, and the bandgap depends on the In composition. By varying the In composition in the three MQW regions, distinctive red, green, and blue colors are possible. In the disclosed embodiment, the Indium concentrations may fall within 22-27% for blue micro-emitter 128, 30-35% for green microemitter 126, and between 42-47% for red microemitter 124.

Silicon doping to achieve n-type. Silicon is the most commonly used n-type dopant for III-nitrides with Si concentrations of about ~$10^{18}$ cm$^{-3}$. Magnesium is commonly used for p-type doing with Mg concentrations in the range of $10^{18}$-$10^{19}$ cm$^{-3}$.

FIG. 2B shows a pixel structure fabricated from structure 200 with common n-contacts 224 and 226 and three independent p-contacts, 228, 230, and 232. The microdisplay is fabricated by etching down to sapphire substrate 202 to isolate each pixel (e.g., pixels 234 and 236) then selectively etching to expose appropriate layers for deposition of contacts, as shown in FIG. 2B). Contacts include three p-type contacts 228, 230, and 232 on p-GaN layers 210, 214, and 218, and two n-type contacts 230 and 232 on the two n-GaN layers 206 and 218. P-type contacts 228, 230, and 232 may be formed with Ni/Au metal stacks, and n-type contacts 230 and 232 may be formed with Ti/Au metal stacks. There are, however, different materials for making n-type and p-type ohmic contacts, for example Pd/Au or ITO could be used to make the p-type ohmic contacts, and Ti/Al for the n-type contacts. Red and green emitters 220 and 216 share a common n-GaN layer 218, and hence a common n-contact 226. The two n-contacts 224 and 226 are connected using a metal interconnection wire 238 that is isolated from underlying surfaces by an electrically insulating/isolation deposit 240.

The result of the etching and other processes is that the red, green, and blue micro-emitting layers 220, 216 and 208 have a common n-electrode (cathode), but that each micro-emitter has an independent p-electrode or anode (p-contacts 232, 230 and 228) which enables independent control of red, green, and blue emission layers 220, 216 and 208, which correspond to the devices represented as micro-emitters 106, 108, and 110 respectively in FIG. 1B.

FIG. 2C shows the schematic circuit scheme which can be created as a result for the purpose of driving the microemitters. As can be seen, FIG. 2C shows the completed arrangement RGB pixel (e.g., any of the plurality of pixels 102 in FIG. 1A or B, or either of pixels 234 and 236 in FIG. 2B) with $V_C$ as the common ground, and $V_R$, $V_G$, $V_B$ for red, green, and blue emitter controls by voltage presented.

P-type GaN layers 210, 214, and 218 may be generated by magnesium doping during epitaxial growth. However, when plasma etching is utilized in device fabrication to expose the p-GaN layers, energetic ions in the plasma may impair the p-type conductivity by introducing nitrogen vacancies and other defects. To overcome this problem, tunneling junctions may be introduced, as the embodiments of FIG. 3.

Figure 3A:
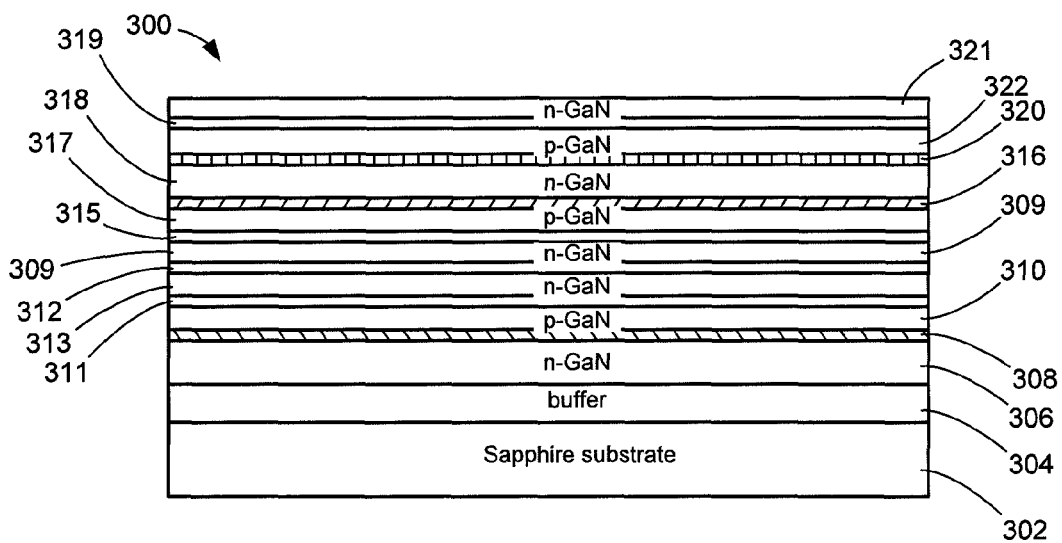
FIG. 3A shows an embodiment of a GaN semiconductor layer structure which incorporates tunneling junctions.
Figure 3B:
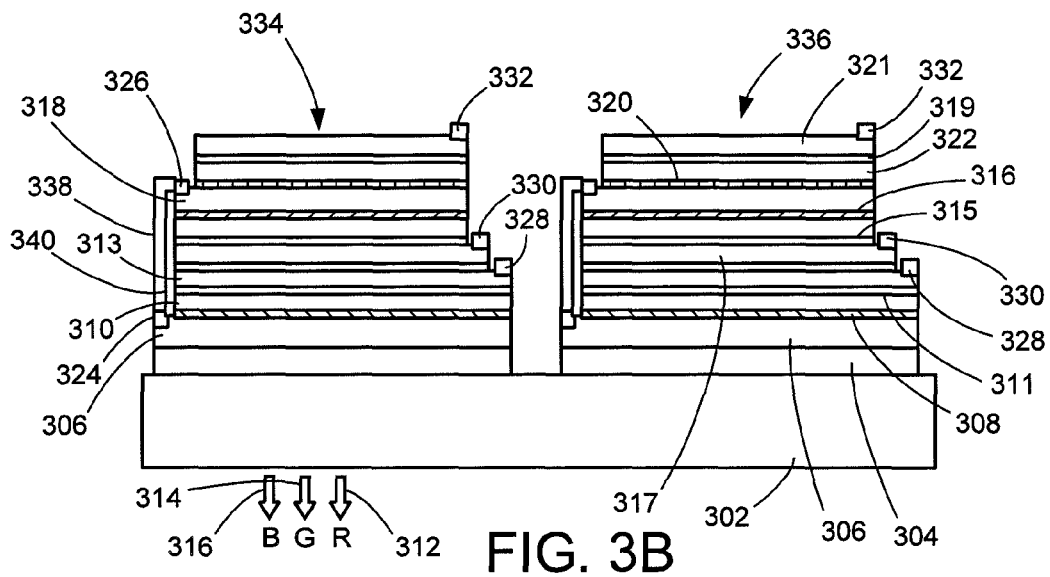
FIG. 3B shows the FIG. 3A embodiment after etching revealing a fabricated pixel structure having a common cathode and three independent anodes.

FIGS. 3A and 3B illustrate a growth structure and fabrication details that may be utilized to form an alternative embodiment of the pixels used in FIG. 1B. Beginning with FIG. 3A, a structure 300 is disclosed which is similar to that shown in FIG. 2A, but for each of p-GaN layers 310, 317, and 322 here, respective tunneling junctions 311, 315, and 319 and n-GaN layers 313, 309, and 321 are inserted. Tunneling junctions are typically sandwiched between thin, heavily doped p$^+$-GaN layers (e.g., p-GaN layers 310, 317, and 322) and a heavily doped n$^+$-GaN layer (e.g., n-GaN layers 313, 309, and 321), so that only a very small reverse voltage is required between each respective n$^+$-GaN and p$^+$-GaN layer to achieve a tunneling current flow through junctions 311, 315, and 319, as is known in the art of making and using tunneling junctions. Structure 300 which will be used to produce pixels consists of a light transparent substrate 302 on which a buffer layer 304 is deposited. Above the buffer layer 304, a first n-GaN layer 306 is enlisted to complement a first MQW 308 for blue emission. Completing the MQW structure from above is a first p-GaN layer 310. A first tunneling junction 311 is deposited immediately above first p-GaN layer 310. A second n-GaN layer 313 is located immediately above tunneling junction 311. Next, an insulative GaN or AlGaN layer 312 is deposited. On top of that, a third n-GaN layer 309 is provided and supports a second tunneling junction 315. A second p-GaN layer 317 is deposited directly above the second tunneling junction 315. Above that, a second MQW 316 for green emission is deposited, then a fourth n-GaN layer 318. A third MQW 320 for red emission, a third p-GaN layer 322, a third tunneling junction 319, and a fifth n-GaN layer 321 complete the structure 300.

The addition of tunneling junctions into the fabrication provides the advantages that all the contacts are made onto the n-GaN using the same metals, and plasma etching problems present in the p-GaN structures are reduced.

A pair of pixels 334 and 336 which have been constructed from the structure 300 are shown in FIG. 3B. These pixels 334 and 336 are similar to those disclosed in FIG. 2B except that tunnel junctioning features are included.

With the insertion of tunneling junctions 311, 315, and 319 and n-GaN layers 313, 309, and 321, each of the color micro-emitters 308, 316, and 320 has an anode (contacts 328, 330, 332) which is constructed on the inserted n-GaN layer. Cathode contacts 324 and 326 are formed on n-GaN layers 306 and 318. Thus, all of contacts 324, 326, 328, 330, and 332 are n-contacts that can be formed with the same Ti/Al based metal stacks as n-contacts 206 and 218 which are shown in FIG. 2B. Because of the presence of the tunneling junctions, all the contacts are made on n-GaN, and the p-GaN surface will not be exposed by plasma etching.

Figure 4A:
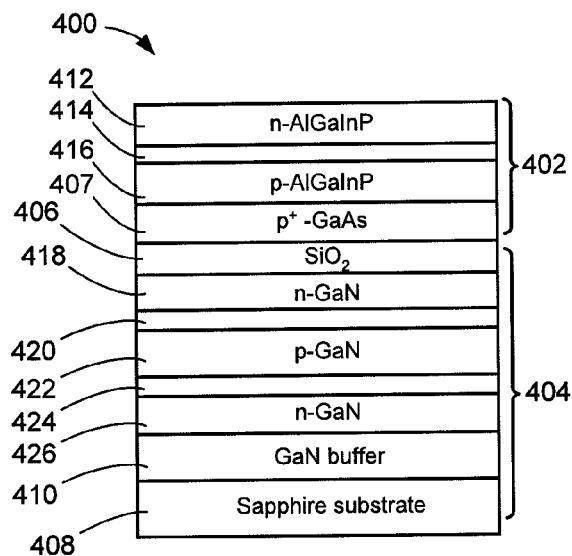
FIG. 4A shows an embodiment having InGaN and AlGaInP hybrid layer structures using InGaN for blue and green emissions, and AlGaInP for red emissions.
Figure 4B:
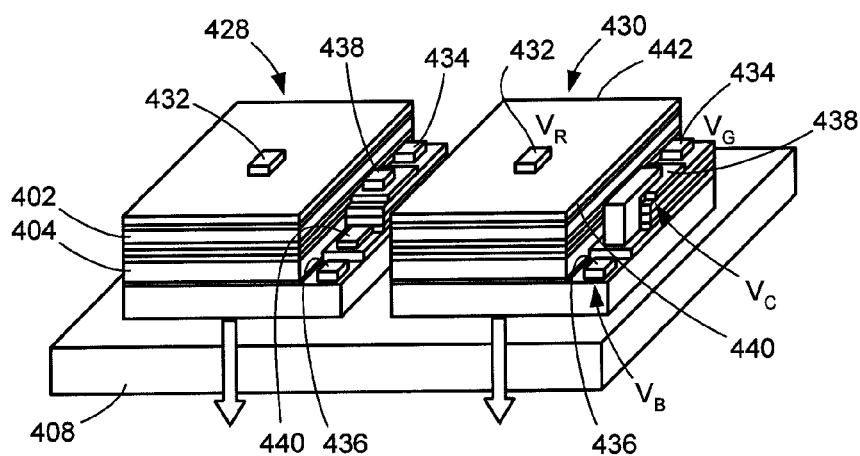
FIG. 4B shows a perspective view of the pixel structure for the embodiment shown in FIG. 4A, but additionally including the electrode arrangement embodiment.
Figure 4C:
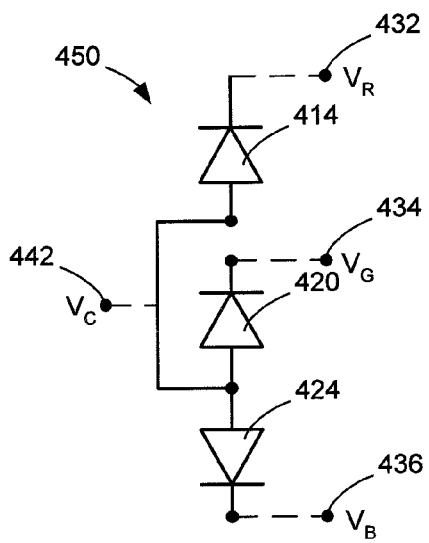
FIG. 4C is a schematic circuit diagram for the FIG. 4B embodiment showing the electrical connections made.

Referring to FIGS. 4A-C, an embodiment based on hybrid integration of III-nitride semiconductors and III-V semiconductors is illustrated. In this structure, a III-V semiconductor such as AlGaInP is used for red emission, and III-nitride semiconductors such as InGaN are used for green and blue emission.

FIG. 4A shows a deposited material structure 400, which includes AlGaInP-based red-emission structures 402 and InGaN-based blue and green structures 404. As can be recalled, in FIGS. 2 and 3, the RGB emitters all are based on III-nitrides. Although red emission for nitride semiconductors has been demonstrated, the efficiency of the red emitters causes them to be less useful. AlInGaP based materials tend to be more efficient as used herein. In FIG. 4A, Structures 402 and 404 are mounted above a sapphire substrate 408 with GaN buffer 410 and together sandwich a red-light transparent p$^+$-GaAs current-spreading layer 407 atop a red-light-transparent SiO$_2$ layer 406. Red-emission structures 402 include an emission layer 414 located between an n-AlGaInP layer 412 and a p-AlGaInP layer 416. Green-emission structures include an emission layer 420 between a p-GaN layer 418 and an n-GaN layer 422 as shown. Blue-emission structures include an emission layer 424 which is deposited between p-GaN layer 422 above, and an n-GaN layer 426 below.

Two pixels produced from structure 400 are shown in FIG. 4B. As will be known to those skilled in the art, a first pixel 428 and a second pixel 430 are similarly formed from structure 400 by etching. Contact-receiving platforms can then be formed to allow for the deposition of cathode structures including (i) a red electrical contact 432, (ii) a green contact 434, and (iii) a blue contact 436. Red emitter has its anode contact 438, and the green and the blue emitters share an anode contact 440. A common anode contact is formed by deposing and then electrically connecting contact 438 with contact 440 using a conductive arch 442 as shown. The first pixel 428 is shown in the initial stage where both contacts 438 and 440 are exposed, and second pixel 430 is shown as it exists after conductive arch 442 is added to complete the electrical connection.

The resulting electrical connections are shown in the circuit diagram of FIG. 4C. As can be seen from this figure, a circuit diagram 450 shows how stacked micro-emitters 414, 420, and 424 are connected such that the three emitters have common anode 442 (V$_C$) with independent cathodes V$_R$, V$_G$, and V$_B$ representing red 432, green 434, and blue 436 contacts.

FIGS. 5A-C show how structure 400 shown in FIG. 4A is generated by wafer bonding of an InGaN material structure 500 and an AlGaInP material structure 502. As illustrated in FIG. 5A, InGaN material structure 500 with stacked green and blue micro-emitter structures (collectively 500) starts from GaN buffer layer 410 on sapphire substrate 408. Blue emitter structure of n-type GaN 426, InGaN MQWs 424, and p-type GaN 422 are epitaxially grown. Then an inverted green emitter structure is grown, formed of p-GaN 422, InGaN MQWs 420, and n-GaN 418. The blue and green emitters share the same p-GaN layer 422 to eliminate the need for one interconnection.

Separately, as shown in FIG. 5B, AlGaInP-based material structure 502 is grown on a GaAs substrate 504. Material structure 502 consists of an n-type GaAs buffer 506 deposited on substrate 504, followed by an n-type AlGaInP lower cladding layer 412, a nominally undoped In$_{0.5}$Ga$_{0.5}$P active region 414 to emit light at about 650 nm, a p-type AlGaInP upper cladding layer 416, and a heavily doped p-GaAs layer 407 as a current-spreading layer.

A variety of wafer bonding techniques, such as wafer fusion, anodic bonding, adhesive bonding may be utilized to bond material structure 502 to material structure 500. Another approach to bonding is based on utilizing a transparent SiO$_2$ layer 406 as a bonding layer as shown in the embodiment disclosed here. SiO$_2$ layer 406 also electrically isolates the red emitter structures from the underlying green-emitter structures. As shown in FIG. 5C, InGaN material structure 500 and AlGaInP material structure 502 are first covered with SiO$_2$ films 508 and 510 about 50 nm thick, by utilizing plasma-enhanced chemical vapor deposition (PECVD), to enhance surface adhesion. Next, InGaN material structure 500 and AlGaInP material structure 502 are each coated with spin-on-glass (SOG) coatings 512 and 514 having thicknesses of about between 50-200 nanometers. SOGs are a class of oxygen-containing compounds which undergo condensation polymerization to form plastic-like layers that can be pyrolyzed at relatively high temperatures (about 400-500° C.) to form inorganic glasses. The SOG is usually spun onto the wafer from solution to form a thin, uniform film which is then baked to complete the glass formation with generally SiO2-like characteristics. The transition from the view in FIG. 5C to the view in FIG. 5D shows that the AlGaInP material structure 502 is turned over and stacked onto InGaN material structure 500 in a bonding fixture. The now-combined material structures 500 and 502 are annealed at high temperature (e.g., >350° C.) under an applied force, resulting in the two material structures 500 and 502 being bonded together to form a composite material structure 516 shown in FIG. 5D.

After bonding, GaAs substrate 504 and buffer layer 516, now on the top of composite material structure 502, are removed by using a selective wet etch based on conventional chemicals (i.e. in a sulfuric acid with hydrogen peroxide solution (1:1)). Resulting from this process is a structure 518 (see FIG. 5E) from which pixels can be fabricated.

The main processes utilized to fabricate stacked RGB pixels out of a composite material structure 600 (created in the steps depicted in FIGS. 5C-E to result in product 518) are illustrated in FIG. 6, including five etch steps that expose specific layers.

Starting from a stacked RGB composite material structure shown in FIG. 6A (which, in this embodiment, is the equivalent of end product 518 in FIG. 5E and the device 400 shown in FIG. 4A) the etching through the materials to form shelves, and then formation of n- and p-contacts 602 and 604, respectively, form an arrangement to drive a red emitter 606, as shown in FIG. 6B. Next, FIG. 6C shows that by etching a shelf into, and then depositing an n-contact formation 608 onto n-GaN layer 418 of a green emitter 420. It can be seen from FIG. 6D that by etching a shelf into the materials, and then forming a p-contact 606 onto common p-GaN layer 422 (which is located below green emissive layer 420 and above blue emissive layer 424) an isolated electrical connection can be made therebetween by depositing a conductive wire 608 over an isolating deposition 610 as shown. This electrically connects contact 606 with the p-contact 604 of red emitter 414 to form a common positive electrode as shown in FIG. 6D. FIG. 6E shows that by etching down to the n-GaN layer 426 to form a shelf, and then depositing an n-contact 612 formation on the shelf formed in the n-GaN layer 426 of the blue emitter 424, a cathode for driving the blue emitter is completed.

FIG. 6F relates how the various contacts formed onto the device relate to the schematic of FIG. 4C, which is an identical schematic of the stacked RGB circuit illustrated in FIGS. 6A-F. The fabricated device is arranged connected such that the three emitters have common anode 442/608 ($V_C$) with independent cathodes 432/602 ($V_R$), 434/608 ($V_G$), and 436/612 ($V_B$) enabling independent operation of red, green, and blue emissions, respectively. Common anode $V_C$ is connected to a positive voltage, and by lowering the independently controlled voltages on the red ($V_R$), green ($V_G$), and blue cathodes respectively, a controlled current flows through each of corresponding red, green and blue emitters 414, 420, and 424, respectively, so that a color and intensity of stacked RGB pixel can therefore be continuously tuned to mix the colors provided by the individual RGB emitters.

Stacked RGB pixels created by the processes illustrated in FIGS. 5A-E and 6A-F, e.g., pixels 428 and 430 (as shown in FIG. 4B), and identical pixel 614 (as shown in FIG. 6F) provide advantages, as discussed above. With red emitter 414 being located on top, green emitter 420 being located in the middle and blue emitter 424 being located at the bottom of the structure, pixel 400 avoids short wavelength absorption by red emitter 414. Further, constructing a common anode (e.g., anode 442/608/$V_C$) for all three emitters 414, 420 and 424 into the device reduces the number of electrodes required to interconnect the emitters. This simplifies fabrication and electrical connectivity. Green emitter 420 has an inverted structure, which enables it to share p-GaN layer 422 with the underlying blue emitter 424. This arrangement facilitates the construction of common anode 442/608/$V_C$ and avoids the problem of isolating the green and blue emitters 422 and 424 from each other.

Figure 7A:
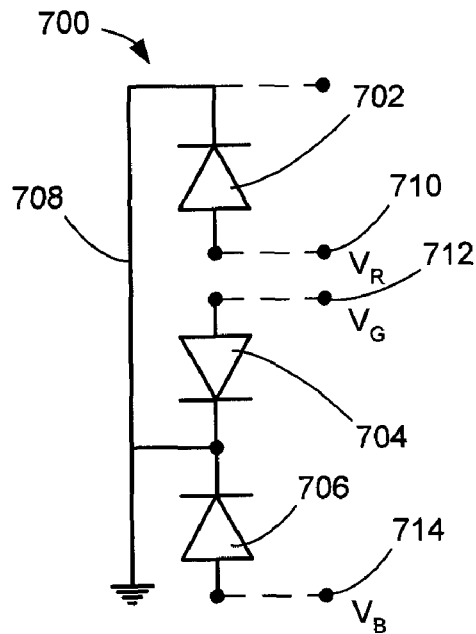
FIG. 7A shows a circuit diagram for an alternative embodiment using three stacked emitters which share a common cathode and have independent anodes.

In order to avoid problems encountered in plasma-etching into p-GaN, tunneling junctions may also be inserted into the InGaN wafer structure. Whereas the embodiment shown in FIG. 4C has three emitters 414, 420 and 424 in one pixel share a common anode 442/608/$V_C$ with independently controllable cathodes 432/602 ($V_R$), 434/608 ($V_G$), and 436/612 ($V_B$) will perform well, adapting conventional driver circuits to meet the connections required may be difficult, or at least more complex than is acceptable in some instances. Because of this, for the purpose of facilitating the ease in presenting a driver-circuit arrangement, another embodiment of the pixel structure is shown in FIG. 7A which incorporates tunneling junctions. In the FIG. 7A embodiment, three stacked emitters 702, 704, and 706 in one pixel 700 share a common cathode 708 as ground, and have independently controllable anodes for red 710 ($V_R$), green 712 ($V_G$), and blue 714 ($V_B$).

Figure 7B:
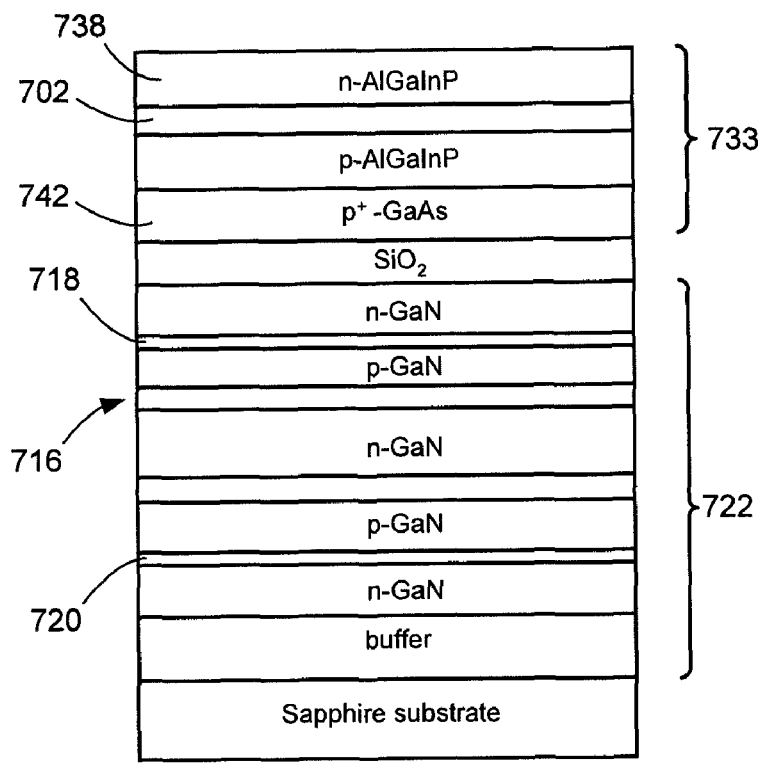
FIG. 7B shows an embodiment in which AlGaInP and InGaN hybrid layer structures are provided along with tunneling-junction structures.
Figure 7C:
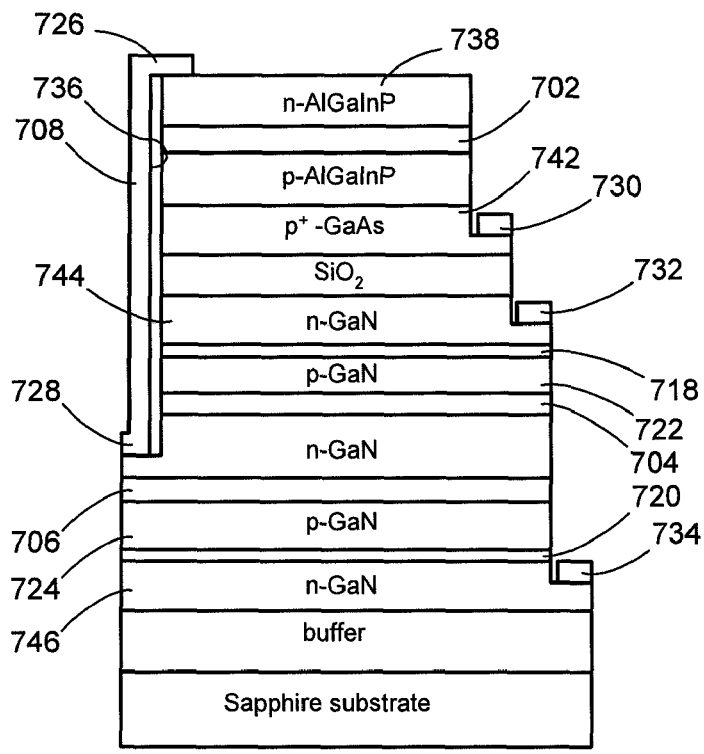
FIG. 7C shows an embodiment for an electrode arrangement created for the device of FIG. 7B.

A hybrid composite material structure 716 shown in FIG. 7B makes a circuit such as shown in FIG. 7A possible. FIG. 7C shows the completed arrangement RGB pixel with $V_C$ as the common ground, and $V_R$, $V_G$, $V_B$ for red, green, and blue emitter controls, respectively. Composite material structure 716 incorporates first and a second tunneling junctions 718 and 720, respectively, that make contact with p-GaN layers 722 and 724. The incorporation of tunneling junctions 718 and 720 minimizes or eliminates plasma etching induced damage on p-type layers 722 and 724. Composite material structure 716 is also formed by wafer bonding of the InGaN wafer (here InGaN wafer 722) and AlGaInP wafer (here AlGaInP wafer 733) in the same manner as wafer 502 is disclosed as being bonded to wafer 500 in FIGS. 5A-E and the related discussions above. Further, one skilled in the art will recognize that the structure 716 in FIG. 7B can be fabricated by etching to include the shelves and contacts revealed in the pixel product disclosed in FIG. 7C. The contact positions here, however, are different to create the necessary connectivity. More specifically, grounded conductive wire 708 is deposited from an upper contact point 726 located on n-AlGaInP layer 738 which is immediately above the red emissive layer 702. Wire 708 is isolated by insulative material 736 until reaching a lower contact point 728 which is made onto a shelf etched into n-GaN layer 740 which is located immediately above blue emission layer 706.

The contacts 730, 732, and 734 used to establish the independently controllable red, green, and blue anodes 710 ($V_R$), green 712 ($V_G$), and blue 714 ($V_B$) all deposited onto etched shelves. Contact 730 is formed onto a shelf etched into p$^+$-GaAs layer 742, contact 732 is formed onto a shelf etched into n-GaN layer 744, and contact 734 is formed onto a shelf etched into n-GaN layer 746.

Figure 8:
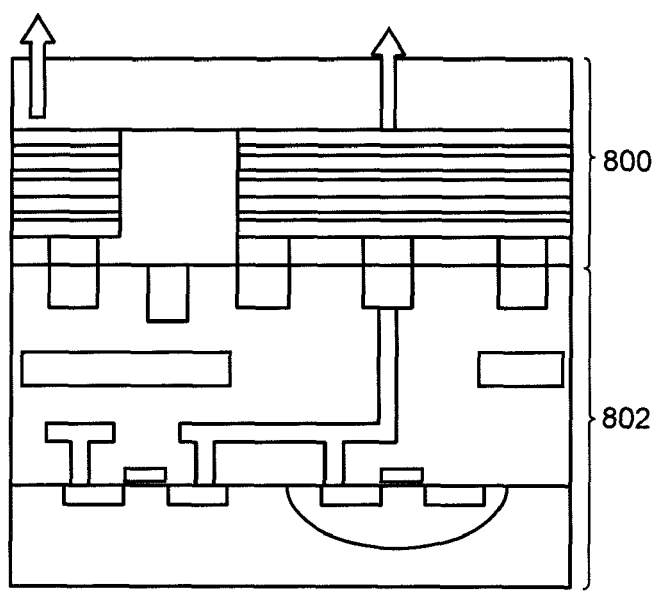
FIG. 8 shows a microdisplay as disclosed above integrated with an IC driver/processor arrangement acting as a backplane.

In embodiments, a high performance microdisplay for full color video information manufactured incorporating the pixel embodiments above may include an active matrix driving circuit and processor. Alternatively, it is even possible that could easily for example be BiCMOS or SiGe or even GaAsIn arrangements could be used. In other embodiments a microdisplay developed using the pixel embodiments disclosed above could be integrated onto IC driver chips by using flip-chip bonding or aligned wafer bonding. Flip-chip bonding (not shown) may utilize indium or other low melting temperature metal bumps, while a high density microdisplay 800 with pixel sizes of less than about 20 microns, may utilize a CMOS-compatible oxide-to-oxide aligned wafer bonding process to integrate microdisplay 800 with an IC driver/processor 802 acting as a backplane, as shown in FIG. 8. In other embodiments, for small format microdisplays, a passive driving scheme can also be implemented.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A pixel for use in a multicolor illumination device, said pixel comprising:
   a red emitter;
   a green emitter; and
   a blue emitter for generating a blue light emission;
   said red, green, and blue emitters being substantially vertically stacked one on top of the other onto a substrate, and
   wherein both of said green and blue emitters are caused to be transparent relative to a red light emission from said red emitter, and said blue emitter is caused to be transparent relative to a green light emission from said green emitter;
wherein said substrate is transparent to all of said red, green, and blue light emissions; and
wherein said pixel structure comprises:
  (i) a buffer layer deposited on said substrate;
  (ii) a first n-GaN layer deposited above said buffer layer;
  (iii) a first InGaN/GaN multi-quantum well (MQW) active region deposited above said first n-GaN layer, said first InGaN/GaN MQW active region being adapted to generate said blue emissions;
  (iv) a first p-GaN layer deposited above said first InGaN/GaN MQW active region;
  (v) an at least semi-insulative layer deposited above said first p-GaN layer;
  (vi) a second p-GaN layer deposited above said at least semi-insulative layer;
  (vii) a second InGaN/GaN MQW active region deposited above said second p-GaN layer, said second InGaN/GaN MQW active region adapted generate said green emissions;
  (viii) a second n-GaN layer deposited above said second InGaN/GaN MQW active region;
  (ix) a third InGaN/GaN MQW active region deposited above said second n-GaN layer, said third InGaN/GaN MQW active region adapted to generate said red emissions; and
  (x) a third p-GaN layer deposited above said third InGaN/GaN MQW active region.

2. The device of claim 1 wherein said InGaN-based structures are separated from said AlGaInP-based structures by a red-light-transparent p$^+$-GaAs current-spreading layer atop a red-light-transparent SiO$_2$ layer.

3. A pixel for use in a multicolor illumination device, said pixel comprising:
  a red emitter;
  a green emitter; and
  a blue emitter for generating a blue light emission; said red, green, and blue emitters being substantially vertically stacked one on top of the other onto a substrate, and wherein both of said green and blue emitters are caused to be transparent relative to a red light emission from said red emitter, and said blue emitter is caused to be transparent relative to a green light emission from said green emitter;
  wherein said pixel is comprised of a hybrid integration of Group III-nitride semiconductors and Group III-V semiconductors;
  wherein said green, and blue emitters are comprised of InGaN-based structures and said red emitter is comprised of AlGaInP-based structures;
  wherein said substrate is transparent to said blue, green, and red emissions, and said pixel has structures comprising:
    a buffer layer on said substrate;
    a first n-GaN layer above said buffer layer;
    a blue emission layer above said first n-GaN layer;
    a first p-GaN layer above said blue emission layer;
    a green emission layer above said first p-GaN layer;
    a second n-GaN layer above said green emission layer;
    an electrically-isolating layer above said second n-GaN layer, said electrically-isolating layer insulating between said InGaN-based structures and said AlGaInP-based structures;
    a current-spreading layer above said electrically-isolating layer;
    a p-AlGaInP layer above said current-spreading layer;
    a red-emission layer above said p-AlGaInP layer; and
    an n-AlGaInP layer above said red-emission layer.

4. The device of claim 3 comprising:
  a common anode for each of said blue, green, and red emitters established by electrically-connecting and grounding said current-spreading layer and said first p-GaN layer;
  a first independent cathode electrically connected with said first n-GaN layer for the purpose of enabling said blue emitter to be selectively activated by administering a voltage to said first independent cathode;
  a second independent cathode electrically connected with said second n-GaN layer for the purpose of enabling said green emitter to be selectively activated by administering a voltage to said second independent cathode;
  a third independent cathode electrically connected with said n-AlGaInP layer for the purpose of enabling said red emitter to be selectively activated by administering a voltage to said third independent cathode.

5. A pixel for use in a multicolor illumination device, said pixel comprising:
  a red emitter;
  a green emitter; and
  a blue emitter for generating a blue light emission; said red, green, and blue emitters being substantially vertically stacked one on top of the other onto a substrate, and wherein both of said green and blue emitters are caused to be transparent relative to a red light emission from said red emitter, and said blue emitter is caused to be transparent relative to a green light emission from said green emitter;
  wherein said pixel is comprised of a hybrid integration of Group III-nitride semiconductors and Group III-V semiconductors;
  wherein said green, and blue emitters are comprised of InGaN-based structures and said red emitter is comprised of AlGaInP-based structures;
  the device further comprising:
    an electrical connection made between a first n-contact associated with said AlGaInP-based structures and a second n-contact, said second n-contact being deposited on an n-GaN layer which is deposited between a green emissive layer and a blue emissive layer;
    said n-GaN layer, green emissive layer, and blue emissive layer all being included in said InGaN-based structures;
    said first and second contacts together creating a common-grounded anode;
    a first cathode associated with and electrically controlling said red emitter;
    a second cathode associated with and electrically controlling said green emitter; and
    a third cathode associated with and electrically controlling said blue emitter.

6. A pixel for use in a multicolor illumination device, said pixel comprising:
  a red emitter;
  a green emitter; and
  a blue emitter for generating a blue light emission;
  said red, green, and blue emitters being substantially vertically stacked one on top of the other onto a substrate, and
  wherein both of said green and blue emitters are transparent relative to a red light emission from said red emitter, and said blue emitter is transparent relative to a green light emission from said green emitter;

wherein said pixel structure comprises:
- (i) a buffer layer deposited on said substrate;
- (ii) a first n-GaN layer deposited above said buffer layer;
- (iii) a first InGaN/GaN multi-quantum well (MQW) active region disposed in electrical contact with said first n-GaN layer, said first InGaN/GaN MQW active region being adapted to generate said blue emissions;
- (iv) a first p-GaN layer disposed in electrical contact with said first InGaN/GaN MQW active region;
- (v) an at least semi-insulative layer deposited above said first p-GaN layer;
- (vi) a second p-GaN layer deposited above said at least semi-insulative layer;
- (vii) a second InGaN/GaN MQW active region disposed in electrical contact with said second p-GaN layer, said second InGaN/GaN MQW active region adapted generate said green emissions;
- (viii) a second n-GaN layer disposed in electrical contact with said second InGaN/GaN MQW active region;
- (ix) a third InGaN/GaN MQW active region disposed in electrical contact with said second n-GaN layer, said third InGaN/GaN MQW active region adapted to generate said red emissions; and
- (x) a third p-GaN layer disposed in electrical contact with said third InGaN/GaN MQW active region.

7. The device of claim 6 wherein said substrate is transparent to all of said red, green, and blue light emissions.

8. The device of claim 7 wherein an order of stacking of said emitters includes said blue emitter being deposited proximate said substrate, said green emitter being deposited above said blue emitter, and said red emitter being deposited above said green emitter, said red, green, and blue light emissions passing through said transparent substrate to contribute to a multicolor display.

9. The device of claim 6 wherein tunneling junctions are inserted into the InGaN-based structures.

10. The device of claim 6 wherein an order of stacking of said emitters includes said red emitter being deposited proximate said substrate, said green emitter being deposited above said red emitter, and said blue emitter being deposited above said green emitter, said red, green, and blue light emissions being directed away from said substrate to contribute to a multicolor display.

11. A pixel for use in a multicolor illumination device, said pixel comprising:
a red emitter;
a green emitter; and
a blue emitter for generating a blue light emission; said red, green, and blue emitters being substantially vertically stacked one on top of the other onto a substrate, and wherein both of said green and blue emitters are caused to be transparent relative to a red light emission from said red emitter, and said blue emitter is caused to be transparent relative to a green light emission from said green emitter;
wherein said pixel is comprised of a hybrid integration of Group III-nitride semiconductors and Group III-V semiconductors;
wherein said green, and blue emitters are comprised of InGaN-based structures and said red emitter is comprised of AlGaInP-based structures;
wherein said substrate is transparent to said blue, green, and red emissions, and said pixel has structures comprising:
a buffer layer on said substrate;
a first Group III-Nitride layer above said buffer layer;
a blue emission layer disposed adjacent to said first Group-III-Nitride layer;
a third Group III-Nitride layer disposed adjacent to said blue emission layer;
a green emission layer disposed adjacent to said first Group-III-Nitride layer;
a second Group-III-Nitride layer above said green emission layer;
an electrically-isolating layer disposed adjacent to said second Group-III-Nitride layer, said electrically-isolating layer insulating between said InGaN-based structures and said AlGaInP-based structures;
a current-spreading layer disposed adjacent to said electrically-isolating layer;
a first AlGaInP layer disposed adjacent to said current-spreading layer;
a red-emission layer disposed adjacent to said AlGaInP layer; and
an second AlGaInP layer disposed adjacent to said red-emission layer.

* * * * *